(12) United States Patent
Seitz

(10) Patent No.: US 6,921,891 B2
(45) Date of Patent: Jul. 26, 2005

(54) PHOTODETECTOR WITH HIGH DYNAMIC RANGE AND INCREASED OPERATING TEMPERATURE

(75) Inventor: Peter Seitz, Urdorf (CH)

(73) Assignee: CSEM Centre Suisse D'Electronique et de Microtechnique SA, Neuchatel (CH)

( * ) Notice: Subject to any disclaimer, the term of this patent is extended or adjusted under 35 U.S.C. 154(b) by 294 days.

(21) Appl. No.: 10/270,924

(22) Filed: Oct. 15, 2002

(65) Prior Publication Data

US 2003/0071196 A1 Apr. 17, 2003

(30) Foreign Application Priority Data

Oct. 16, 2001 (EP) ............................................. 01811011

(51) Int. Cl.[7] ................................................. H01J 40/14
(52) U.S. Cl. ................................ 250/214 R; 250/208.1
(58) Field of Search ........................ 250/214 R, 214.1, 250/208.1, 214 LS; 348/308, 309, 310, 320

(56) References Cited

U.S. PATENT DOCUMENTS

| 4,980,546 A | | 12/1990 | Berger | |
|---|---|---|---|---|
| 5,376,782 A | * | 12/1994 | Ikeda et al. | 250/208.1 |
| 5,721,422 A | * | 2/1998 | Bird | 250/208.1 |
| 5,854,498 A | | 12/1998 | Merrill | |

FOREIGN PATENT DOCUMENTS

| EP | 1 003 329 A1 | 5/2000 |
|---|---|---|

OTHER PUBLICATIONS

Patent Abstracts of Japan, Solid–State Image Pickup Device, Publication Date: Aug. 20, 1986.

Elektronisch sehen, Alternative zur CCD–STruktur bewaltigt hohe Helligkeitadynamik, Bauelemente, CMOS–Bildsensor, Elektronik Mar. 1995, pp. 52–57.

Wide–Dynmic–Range Pixel with Combined Linear and Logarithmic Response and Increased Signal Swing, Sensors and Camera Systems for Scientific, SPIE vol. 3965, pp. 4–10.

WO 01/47021 A1, Method and Apparatus for Achieving Uniform Low Dark Current with CMOS Photodiodes, Publication Date: Jun 28, 2001.

* cited by examiner

*Primary Examiner*—Que T. Le
(74) *Attorney, Agent, or Firm*—Rankin, Hill, Porter & Clark LLP

(57) ABSTRACT

A photodiode (1) in a conventional photodetector-pixel architecture is supplied with a shunt diode (2) connected to a control voltage ($V_o$). Suitable selection of the constant or time-varying control voltage ($V_c$) allows a combination of linear and non-linear, preferably logarithmic illumination response of the photodiode (1), resulting in a high dynamic photodetecting range of more than five orders of magnitude. The properties of the shunt diode (2) and the control voltage ($V_c$) can be chosen such that the resulting dark current matches the dark current of the photodiode (1), which becomes independent of voltage for high temperatures. This enables photodetecting with a sufficient dynamic range at higher temperatures than possible with conventional photodetectors.

14 Claims, 3 Drawing Sheets

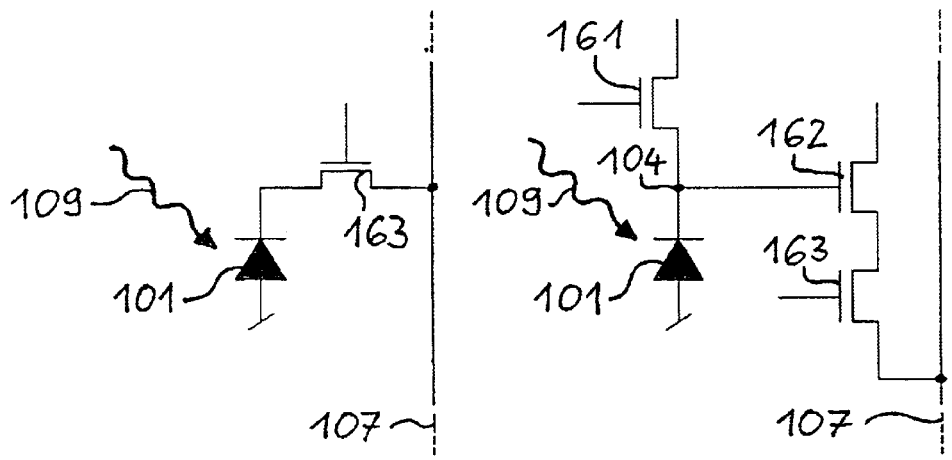
Fig. 1  PRIOR ART        Fig. 2  PRIOR ART
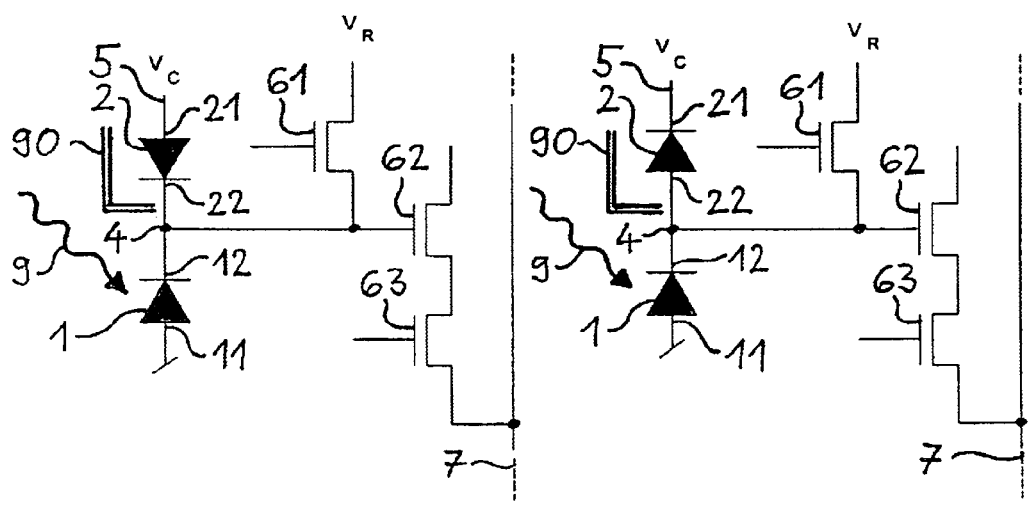
Fig. 3                    Fig. 4

PHOTODETECTOR WITH HIGH DYNAMIC RANGE AND INCREASED OPERATING TEMPERATURE

BACKGROUND OF THE INVENTION

1. Field of the Invention

This invention relates to solid-state photodetecting, especially complementary metal oxide semiconductor (CMOS) or active pixel sensor (APS) photodetecting, in which photodiodes are used as the photodetecting elements. More particularly, the invention relates to a photodetector, to an optoelectronic image sensor using said photodetector and to a method for sensing electromagnetic radiation using said photodetector. The invention is useful for all photodetecting applications in which a dynamic range exceeding three orders of magnitude (60 dB) is required, such as security, surveillance, automotive, soldering, etc. It is also useful for photodetecting applications at elevated temperatures (above 80° to 100° C.), in which exponentially increasing dark current severely limits the dynamic range of conventional photodetectors.

2. Description of Related Art

Solid-state image sensors and cameras find more and more applications in areas where the environmental conditions cannot be well controlled. There are two main problems resulting from this fact:

A. Firstly, the large variations of illumination in uncontrolled surroundings call for a photodetector with a dynamic range that is significantly larger than the 50–60 dB of conventional cameras.

B. Secondly, high surrounding temperatures (above 80° to 100° C.) cause a high level of dark current that can severely limit the voltage swing of the photodiodes, leading to an unacceptable loss of contrast.

A. Dynamic Range

The state of the art in image sensors with high dynamic range is based on two different approaches:

(i) multiple exposures of the same scene with different exposure times and subsequent combination of the obtained image data into one image offering high dynamic range; or (ii) non-linear compression of the pixel response, by reducing a pixel's sensitivity for high illumination levels.

A good overview of the different methods in the first category (i) of multiple-exposure techniques is given by O. Yadid-Pecht ("Wide dynamic range sensors", Optical Engineering, Vol. 38, pp. 1650–1660, 1999). All methods share the common disadvantage that they have to store data of the different exposures, either in analog or in digital form. Often complete images have to be stored, and in the best of cases, several lines or pixels of an image have to be stored, as disclosed by Seitz et al. in EP-1,003,329 A1. A second disadvantage of the multi-exposure methods is the required computational effort necessary for combining data from the differently exposed images, while avoiding image artifacts that arise from the combination of photodetector signals whose properties are not precisely known. This can be caused by cross-talk, dark current, non-linearities in the response or temperature dependent transistor parameters.

The second category (ii) of methods that obtain a high dynamic range by response compression encompasses logarithmic compression with a metal oxide semiconductor (MOS) field effect transistor (FET), as taught by H. Graf et al. ("Elektronisch Sehen", Elektronik, Vol. 3, pp. 3–7, 1995).

A disadvantage of such a "logarithmic pixel" is the severe reduction of the response speed at low illumination levels. This can be overcome by combining a linear response at low light levels with a logarithmic response at high light levels. This is achieved by adding a reset transistor in parallel to the transistor that performs the logarithmic compression. International publication WO-01/46655 A1 (M. Wäny) teaches how the same functionality can be obtained with a single transistor whose gate is driven with a suitable voltage pattern. In all three cases, transistors are employed as non-linear elements that have some disadvantages in this application. The threshold voltage and, therefore, the on-set of the logarithmic compression depends on temperature and properties of the oxide that might change with time such as mobile oxide charges. Alternatively, the pixel at the same time requires precise timing (for carrying out the reset operation) and precise voltage levels (for carrying out logarithmic compression) which is not easy to realize. A further disadvantage are the variations of the semiconductor process while fabricating the transistors, resulting in nonuniform parameters of the pixels. As a consequence, the response of the different pixels must be adapted to each other, either by digital post-processing, or by increasing the size of the transistors that carry out the logarithmic compression to reduce the variations from pixel to pixel.

B. Dark Current

The second practical problem addressed by the present invention is a photodiode's dark current that doubles for every increase in temperature by about 8° C. If temperatures approach 100° C. or if they are even increased above, as it can occur for example in automotive applications, the dark current can be much larger than the photocurrent. This leads to a situation in which the photosignal is drowned in the temperature-induced offset signal. This problem is conventionally addressed by improving the employed semiconductor process in terms of reduced dark current. However, process changes involve higher costs and technical problems.

SUMMARY OF THE INVENTION

It is an object of the invention to provide a photodetector that avoids the above-mentioned disadvantages of the prior art. In particular, the photodetector shall enable photodetecting with a high dynamic range, i.e., exceeding 60 dB, and/or photodetecting at high temperatures, i.e., above 80° to 100° C. It shall preferably be manufacturable using a standard semiconductor technology. It is a further object of the invention to provide a method for detecting electromagnetic radiation at the conditions indicated above. These and other objects are solved by the photodetector and the method for detecting electromagnetic radiation according to the present invention.

The present photodetector offers a solution to both the dynamic-range and the dark-current problem, either individually or in combination.

The photodetector according to the invention employs a shunt (or compensation) diode connected to the cathode of the photodiode and preferably shielded from incident light and photogenerated charge carriers. The other terminal of the shunt diode is connected to a voltage source (a control voltage) that is either common to one pixel, a group of pixels, or all pixels on an image sensor. For increasing the dynamic range of a pixel, the cathode of the shunt diode is connected to the cathode of the photodiode, for increasing the operational temperature range of a pixel, the anode of the shunt diode is connected to the cathode of the photodiode.

More specifically, the photodetector according to the invention comprises a photodetecting element for generating electric charge carriers as a function of incident electromagnetic radiation, coupled between a ground line and a sense node, and a diode element coupled between the sense node and a control line.

The cathode or the anode of the diode element is connected to the sense node. In the former case, a non-linear response of the photodiode and thus a high dynamic range can be achieved; in the latter case, the dark current of the photodiode can be compensated such that the photodetector can be operated at higher temperatures. There may be provided means for switching between a first state in which the cathode of the diode element is connected to the sense node and a second state in which the anode of the diode element is connected to the sense node.

The photodetector according to the invention may be realized with photodiodes based on diffusions of one semiconductor conduction type in contact with the opposite conduction type, such as the MOS array pixel or the CMOS sensor pixel, also called active pixel sensor (APS). Alternatively, it may be realized with floating diffusion (i.e., diode) readout structures, as employed for example in charge coupled device (CCD) image sensors.

The optoelectronic image sensor according to the invention comprises a plurality of photodetectors as described above, the photodetectors being preferably arranged in rows and columns of a two-dimensional matrix.

According to the method for detecting electromagnetic radiation using the photodetector according to the invention, a photodetecting element having a first and a second terminal is connected by its first terminal to a ground voltage and by its second terminal to a sense node. A diode element having a first and a second terminal is connected by its first terminal to the second terminal of the photodetecting element and by its second terminal to a control-voltage line. The photodetecting element is biased with a bias voltage. Electric photocharges are generated in the photodetecting element as a function of incident electromagnetic radiation.

Throughout this document, the terms "light" and "photo . . . " are used for any kind of electromagnetic radiation, such as visible light, infrared (IR) or ultraviolet (UV) radiation.

BRIEF DESCRIPTION OF THE DRAWINGS

The invention and, for comparison, the prior art is described in greater detail hereinafter relative to the attached schematic drawings.

FIG. 1 shows a circuit diagram of a MOS array pixel according to the prior art.

FIG. 2 shows a circuit diagram of a CMOS (APS) sensor pixel according to the prior art.

FIG. 3 shows a circuit diagram of a first embodiment of the photodetector according to the invention.

FIG. 4 shows a circuit diagram of a second embodiment of the photodetector according to the invention.

DETAILED DESCRIPTION OF THE PREFERRED EMBODIMENTS

Figure 5:
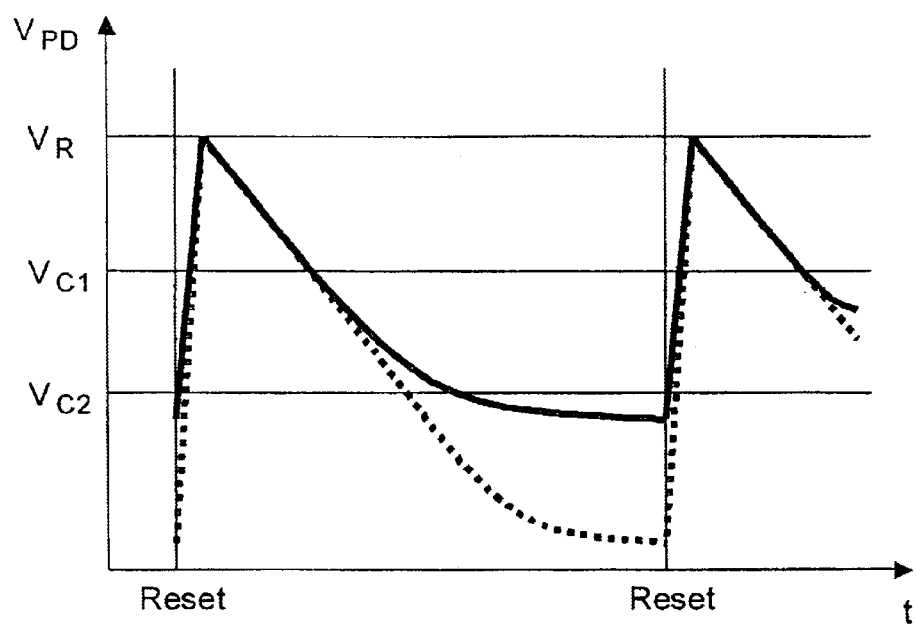
FIG. 5 shows a graphical representation of the response of the photodetector according to the invention for two different control voltages.

Conventional realizations of photodetector pixels based on photodiodes based on diffusions of one semiconductor conduction type in contact with the opposite conduction type are illustrated in FIGS. 1 and 2. The basic pixel architecture illustrated in FIG. 1 is known as MOS-array pixel, the pixel type shown in FIG. 2 is called active pixel sensor (APS) or CMOS-sensor pixel. The pixels comprise a photodiode 101 for generating electric charge carriers as a function of incident light 109. The MOS-array pixel of FIG. 1 has a row-select transistor 163. The CMOS-sensor pixel of FIG. 2 comprises a sense node 104 at the output of the photodiode 101, a reset transistor 161, a source-follower transistor 162 and a row-select transistor 163. The outputs of the photodiodes are connectable to a column line 107 that leads to a column amplifier.

The photodetector pixel according to the invention, shown in FIGS. 3 and 4, comprises a photodiode 1 for generating electric charge carriers as a function of incident light 9. The anode 11 of the photodiode 1 is grounded and the cathode 12 of the photodiode 1 is connected to a sense node 4 for reading out the generated photocharge. As known from the prior art (cf. FIG. 2), the pixel further comprises a reset switch 61, a source follower 62 and a row-select switch 63. The pixel's output signal is read out by means of a column line 7.

The pixel further comprises a shunt diode or compensation diode 2 preferably shielded from the incident light 9 and photogenerated charge carriers. The shunt diode 2 is connected by its first terminal 22 to the cathode 12 of the photodiode 1 and, thus, to the sense node 4. The other terminal 21 of the shunt diode 2 is connected to a control line on which a control voltage $V_C$ is generated, for example, by a control-voltage source (not shown). The control-voltage source is either common to one pixel, a group of pixels, or all pixels on an image sensor. For increasing the dynamic range of a pixel, the cathode 22 of the shunt diode 2 is connected to the cathode 12 of the photodiode 1, as illustrated in FIG. 3. For increasing the operational temperature range of a pixel, the anode 21 of the shunt diode 2 is connected to the cathode 12 of the photodiode 1, as illustrated in FIG. 4. FIGS. 3 and 4 relate to APS/CMOS pixels, but the same invention can also be used in MOS-array pixels or any other photodetectors that rely on photodiodes or floating-diffusion readout structures, as for example employed in CCDs.

In both embodiments shown in FIGS. 3 and 4, the readout of the photodiode 1 or floating-diffusion diode is realized in the conventional manner of first biasing the photodiode with the reset switch 6 to a reverse bias voltage $V_R$. During the exposure time, incident light 9 impinges upon the reverse biased photodiode 1 and the generated photocurrent partially discharges the photodiode 1 to a voltage $V_{PD}$. The resulting voltage $V_{PD}$, measured for example with a source follower circuit, is related to the total integrated photocharge Q by:

$$Q = (V_R - V_{PD}) \cdot C \tag{1}$$

where C is the total effective capacitance in parallel with the photodiode 1.

In a first embodiment of the invention, illustrated in FIG. 3, the shunt diode 2 is connected with its cathode 22 to the cathode 12 of the photodiode 1. The shunt diode 2 is preferably shielded from the incident light 9 by appropriate shielding means 90, which are only schematically sketched in FIG. 3. The control voltage $V_C$ is either constant with time or is temporally modulated, synchronously with the reset clocking. In the first case of constant control voltage $V_C$ its value is chosen between 0 V and $V_R$. The shunt diode's current I shows an exponential behavior as a function of the voltage V across its terminals:

$$I = I_0 \cdot \exp[(qV)/(nkT) - 1] \quad (2)$$

with a dark current $I_0$ that depends on the semiconductor process, and where $q = 1.60 \cdot 10^{-19}$ as denotes the unit charge of an electron, $k = 1.38 \cdot 10^{-23}$ J/K the Boltzmann constant, T the absolute temperature and n an ideality factor between 1 and 2. As a consequence, the shunt diode 2 will not appreciably conduct as long as the photodiode voltage $V_{PD}$ is above $V_C$. In this case, the photodiode 1 shows a linear response in voltage as a function of integrated photocharge as described by Equation (1).

As soon as the photodiode voltage $V_{PD}$ is lower than $V_C$, the shunt diode 2 will start to conduct current in the exponential manner described by Equation (2). As a consequence, the photodiode voltage $V_{PD}$ is not any more reduced linearly but rather logarithmically, since Equation (2) can be solved for the voltage:

$$V = (nkT)/q \cdot \ln[I/I_0 - 1] \quad (3)$$

where ln denotes the natural logarithm. This implies that the response of the pixel according to the present invention is linear for low illumination levels, and is logarithmic for high illumination levels.

FIG. 5 shows the discharge behavior of the photodetector according to the invention (i.e., the voltage $V_{PD}$ across the photodiode 1 versus time t during illumination, during one readout cycle between two resets) for two different control voltages: a first, higher control voltage $V_{C1}$ (solid line) and a second, lower voltage $V_{C2}$ (dashed line), wherein $0 V < V_{C2} < V_{C1} < V_R$. The cross-over point from linear to logarithmic behavior is selected by the control voltage $V_C$: if the linear range should be increased, then $V_C$ must be reduced to lower voltages; if the logarithmic compression should start already at low illumination levels (for small photocurrents), then $V_C$ should be chosen close to $V_R$. In this way, a similar linear-logarithmic response as in publication WO-01/46655 A1 (M. Wäny) is achieved, but without using active elements such as transistors. This logarithmic compression leads to a strongly increased dynamic range of the photodetector, well above 100 dB (five orders of magnitude of the detected radiation).

It is also possible to vary the shunt diode's control voltage $V_C$ as a function of time, either to adapt it to a modulated source of light or to obtain a compression that is in deviation of the linear-logarithmic response described above for constant $V_C$.

In a second embodiment of the invention, illustrated in FIG. 4, the anode 21 of the shunt diode 2 is connected to the cathode 12 of the photodiode 1. The control voltage $V_C$ is chosen so that the shunt diode 2 is reverse biased, i.e., only the dark current flows through the shunt diode 2, as predicted by Equation (2) for a strongly negative bias voltage V. This can be achieved by applying a control voltage $V_C$ that is equal to or greater than $V_R$. If the geometry and the properties of the shunt diode 2 are chosen appropriately, it is possible to obtain the same dark current as in the photodiode 1 (although this is strictly correct for one given temperature only, since different diodes show different temperature behavior). This means that, in the circuit illustrated in FIG. 4, the dark current of the photodiode 1 is compensated by the dark current of the shunt diode 2. As a result, only the photocurrent contributes to the linear integration described by Equation (1), and the dark current influences the photocurrent integration much less than in the conventional pixels, where the dark current is not compensated and can become much larger than the photocurrent at elevated temperatures.

The ideal diode model of Equation (1) is only true for diodes 1 that are limited by diffusion. This is typically not true at medium to low temperatures (below 75 to 125° C., depending on the semiconductor material and process), for which the reverse (dark) current is a function of the reverse bias, showing normally a square-root behavior. At higher temperatures, however, the assumptions that are necessary for the present invention are fulfilled, and the reverse (dark) current is not any more a function of reverse bias voltage.

Figure 6:
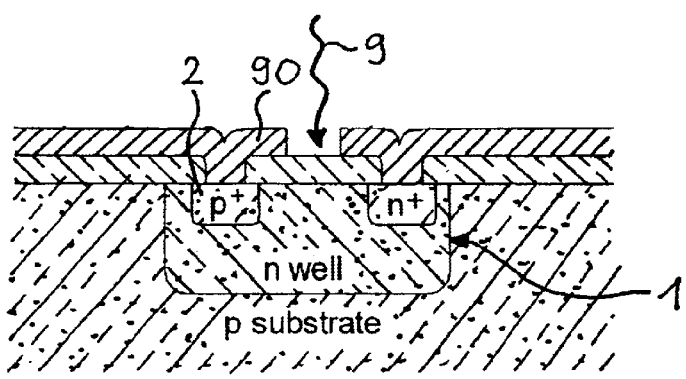
FIG. 6 shows a schematic cross section through part of the photodetector according to the invention designed as a single-well pixel in CMOS technology.

FIG. 6 shows a preferred embodiment in CMOS technology of the cathode-connected shunt diode 2 for the high-dynamic-range pixel (cf. FIG. 3). For minimum space requirements, the photodiode 1 is realized as an n well in a p substrate, and the shunt diode 2 is realized as a $p^+$ contact in the n well, covered by an opaque metal shield 90. The metal layers are electrically isolated from the semiconductor structures by insulator layers. As will be clear to those skilled in the art, other semiconductor conduction types can be used for the same purpose, e.g., a p well in an n substrate etc.

This single-well embodiment of the shunt-diode pixel shown in FIG. 6 acts also as a bipolar p-n-p transistor, and a certain current is directly flowing from the $p^+$ contact to the p substrate. As known from bipolar transistor theory, this direct diffusion current is the so-called beta factor times the current in the n well, i.e., the photocurrent that is compensated. The value of the beta factor depends on the details of the technology, and it can be between 5 and 20 for state-of-the-art CMOS technologies. For this reason, the single-well embodiment of the shunt-diode pixel is well suited for all applications in which ultra-low power consumption is not of utmost importance.

Figure 7:
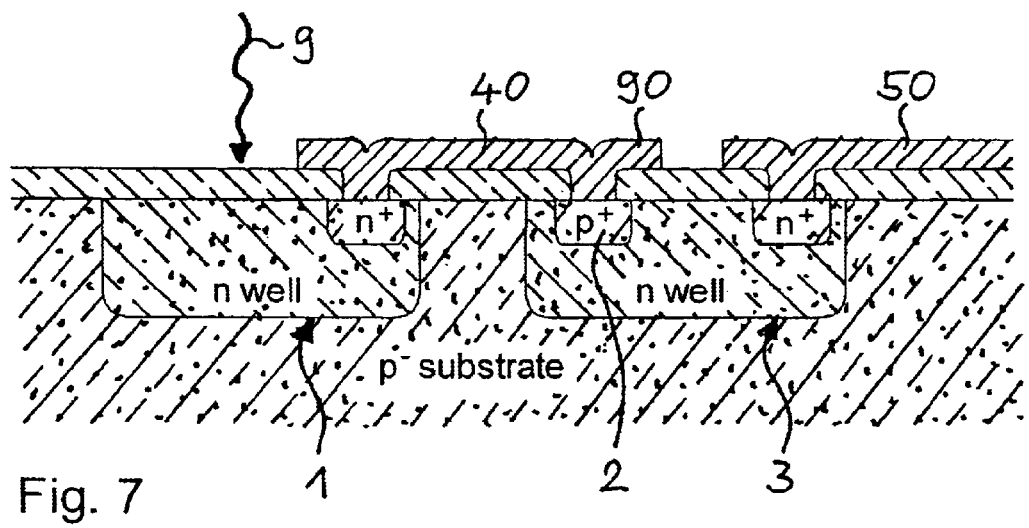
FIG. 7 shows a schematic cross section through part of the photodetector according to the invention designed as two separate diode wells in CMOS technology.

For ultra-low power consumption, it is necessary to adapt the semiconductor process/design such that the shunt diode 2 can be realized without a pronounced bipolar transistor effect in the well. FIG. 7 shows a cross section through such a structure with two separate diode wells embedded in a $p^-$ substrate. A first n well with an $n^+$ contact forms the photodiode 1. A second n well includes a $p^+$ contact, which forms the shunt diode 2, and an $n^+$ contact. The second n well forms a parasitic diode 3 (cf. FIG. 8). The $n^+$ contact in the first n well and the $p^+$ contact in the second n well are connected by a first metal layer 40 that includes the sense node 4. By means of a second metal layer 50 connected to the $n^+$ contact in the second n well, the control voltage $V_C$ can be applied to the cathode 22 of the shunt diode 2. Of course, other semiconductor conduction types than those described with reference to FIG. 7 can be used in order to design an analogous structure.

Figure 8:
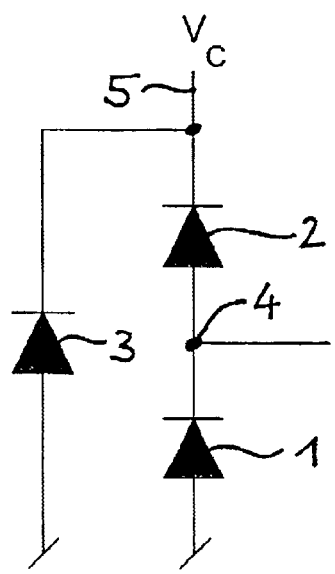
FIG. 8 shows a circuit diagram equivalent to the structure of FIG. 7.

An electrical equivalent schematics corresponding to the structure of FIG. 7 is shown in FIG. 8.

Figure 9:
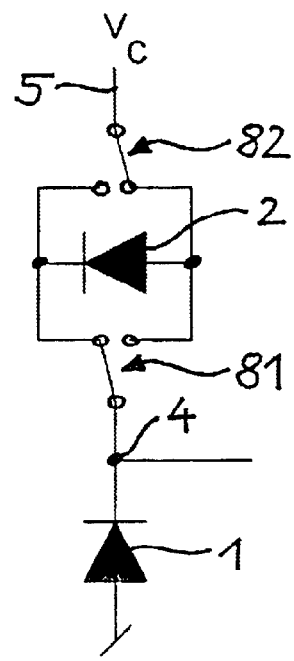
FIG. 9 shows a circuit diagram of a third embodiment of the photodetector according to the invention.

The diode arrangement of a further, third embodiment of the invention is shown in FIG. 9. This third embodiment combines the two embodiments shown in FIGS. 3 and 4 in a single circuit with appropriate switching elements 81, 82 for switching the polarity of the shunt diode 2, and thus selecting one of the two embodiments of FIG. 3 or 4. In FIG. 9, the switching elements 81, 82 are represented only very schematically; they can be realized, for example, with appropriate arrangements of transistors as will be apparent to those skilled in the art. The switching elements 81, 82 are shown in a position corresponding to the cathode—cathode arrangement of FIG. 3. If both switching elements 81, 82 are switched to their opposite positions, one obtains the cathode-anode arrangement of FIG. 4. With the embodiment of FIG. 9, it is also possible to bypass the shunt diode 2 by switching only one of the two switching elements 81, 82.

This invention is not limited to the preferred embodiments described above, to which variations and improvements may be made, without departing from the scope of protection of the present patent.

LIST OF REFERENCE SIGNS

1, 101 Photodiode
11 Photodiode anode
12 Photodiode cathode
2 Shunt diode
21 Shunt-diode anode
22 Shunt-diode cathode
3 Parasitic diode
4, 104 Sense node
5 Control line
61, 161 Reset switch
62, 162 Source follower
63, 163 Row-select switch
7, 107 Column line
81, 82 Switching elements
9, 109 Incident light
90 Shielding means

I claim:

1. A photodetector comprising:
   a photodetecting element for generating electric charge carriers as a function of incident electromagnetic radiation, coupled between a ground line and a sense node;
   a reset element for resetting the photodetecting element, coupled between the sense node and a reset line; and
   a diode element that is distinct from the photodetecting element and the reset element, said diode element being coupled between the sense node and a control line.

2. The photodetector according to claim 1, wherein said diode element has an anode, and a cathode, and the cathode is connected to the sense node.

3. The photodetector according to claim 1, wherein said diode element has an anode and a cathode, and the anode is connected to the sense node.

4. The photodetector according to claim 1, wherein said diode element has an anode and a cathode, and means are provided for switching between a first state in which the cathode of said diode element is connected to the sense node and a second state in which the anode of said diode element is connected to the sense node.

5. The photodetector according to claim 1, wherein said photodetecting element is a photodiode or a floating-diffusion diode.

6. The photodetector according to claim 5, wherein said photodetector is fabricated in CMOS technology, and preferably said photodetecting element is a photodiode realized as a well of a first semiconductor type in a substrate of a second semiconductor type and said diode element is realized as a contact of a third semiconductor type in said well.

7. The photodetector according to claim 1, wherein said diode element is shielded from incident electromagnetic radiation.

8. An optoelectronic image sensor, comprising:
   a plurality of photodetectors arranged in rows and columns of a two-dimensional matrix, each of said photodetectors including:
   a photodetecting element for generating electric charge carriers as a function of incident electromagnetic radiation, coupled between a ground line and a sense node;
   a reset element for resetting the photodetecting element, coupled between the sense node and a reset line; and
   a diode element that is distinct from the photodetecting element and the reset element, said diode element being coupled between the sense node and a control line.

9. A method for detecting electromagnetic radiation using a photodetector, said photodetector including a photodetecting element, a reset element, and a diode element that are distinct from one another, said photodetecting element having a first terminal and a second terminal and being operable to generate electric charge carriers as a function of incident electromagnetic radiation, coupled between a ground line and a sense node, said reset element being coupled between the sense node and a reset line, and said diode element having a first terminal and a second terminal and being coupled between the sense node and a control line, said method comprising the steps of:
   connecting the photodetecting element first terminal to the ground voltage and the photodetecting element second terminal to the sense node;
   connecting the diode first terminal to the second terminal of said photodetecting element and the diode second terminal to a control-voltage line on which a control voltage is generated;
   biasing said photodetecting element with a bias voltage; and,
   generating in said photodetecting element electric photo-charges as a function of incident electromagnetic radiation.

10. The method according to claim 9, wherein said diode element has an anode and a cathode, and wherein the diode cathode is connected to the second terminal of said photodetecting element, and said control voltage is chosen to lie within an interval defined by said ground voltage and said bias voltage.

11. The method according to claim 9, wherein said diode element has an anode and a cathode, said diode element anode being connected to the second terminal of said photodetecting element, and said control voltage is chosen to be equal to or greater than said bias voltage.

12. The method according to claim 11, wherein said diode element is operable to conduct dark current the same as said photodetecting element in order to compensate the dark current of said photodetecting element.

13. The method according to claim 9, wherein said control voltage is selected from the group consisting of constant and time-varied.

14. The photodetector according to claim 1, wherein the reset element is a transistor.

* * * * *